FREQUENCY AND PHASE DISCRIMINATOR

Filed Feb. 21, 1957 2 Sheets-Sheet 1

INVENTOR.
NOEL E. HOGUE
BY Moody and Goldman
ATTORNEYS

Jan. 24, 1961 N. E. HOGUE 2,969,468
FREQUENCY AND PHASE DISCRIMINATOR
Filed Feb. 21, 1957 2 Sheets-Sheet 2

INVENTOR.
NOEL E. HOGUE
BY Moody and Goldsmith
ATTORNEYS 2,969,468

FREQUENCY AND PHASE DISCRIMINATOR

Noel E. Hogue, Cedar Rapids, Iowa, assignor to Collins Radio Company, Cedar Rapids, Iowa, a corporation of Iowa Filed Feb. 21, 1957, Ser. No. 641,576

5 Claims. (Cl. 307—88.5)

This invention relates to a circuit capable of detecting both frequency and phase modulated waves.

The use of both frequency and phase discrimination is often required in stabilized-master-oscillator systems, in which the output of a variable oscillator is brought into phase lock with a reference frequency derived from an extremely stable source. Such systems use the outputs of frequency and phase detectors to operate a regulator-feedback loop. At the initiation of the regulation process, the variable oscillator frequency is often so distant from the reference oscillator frequency that it is not possible to effect a phase locked condition with phase discriminator action alone. The usual procedure in such cases is to use a frequency discriminator to bring the variable oscillator signal within the capture range of the phase discriminator.

However, this results in considerable circuit complication due to the use of separate frequency and phase discriminators.

This invention teaches how a combined frequency and phase detector can be made, wherein essentially the same components are utilized for both the frequency and phase-detecting operations. Furthermore, the invention is readily designed for application in low impedance circuits such as required by transistors, although the design is not limited to this use. Also, the circuit does not require the use of critically designed R–F transformers as is often the case with conventional discriminators.

The invention includes a pair of tank circuits, each having one end connected to the circuit input. Each tank circuit is parallel-resonant at a different frequency, one being above and the other being below a chosen reference frequency. A reference-signal source is connected through isolating impedances to the other ends of the tank circuits. The other ends of the tank circuits are also connected through diode detectors to a low-pass filter, which provides the circuit output.

Further objects, features and advantages of this invention will be apparent to a person skilled in the art upon further study of the specification and drawings, in which.

Figures 1, 2, 3:
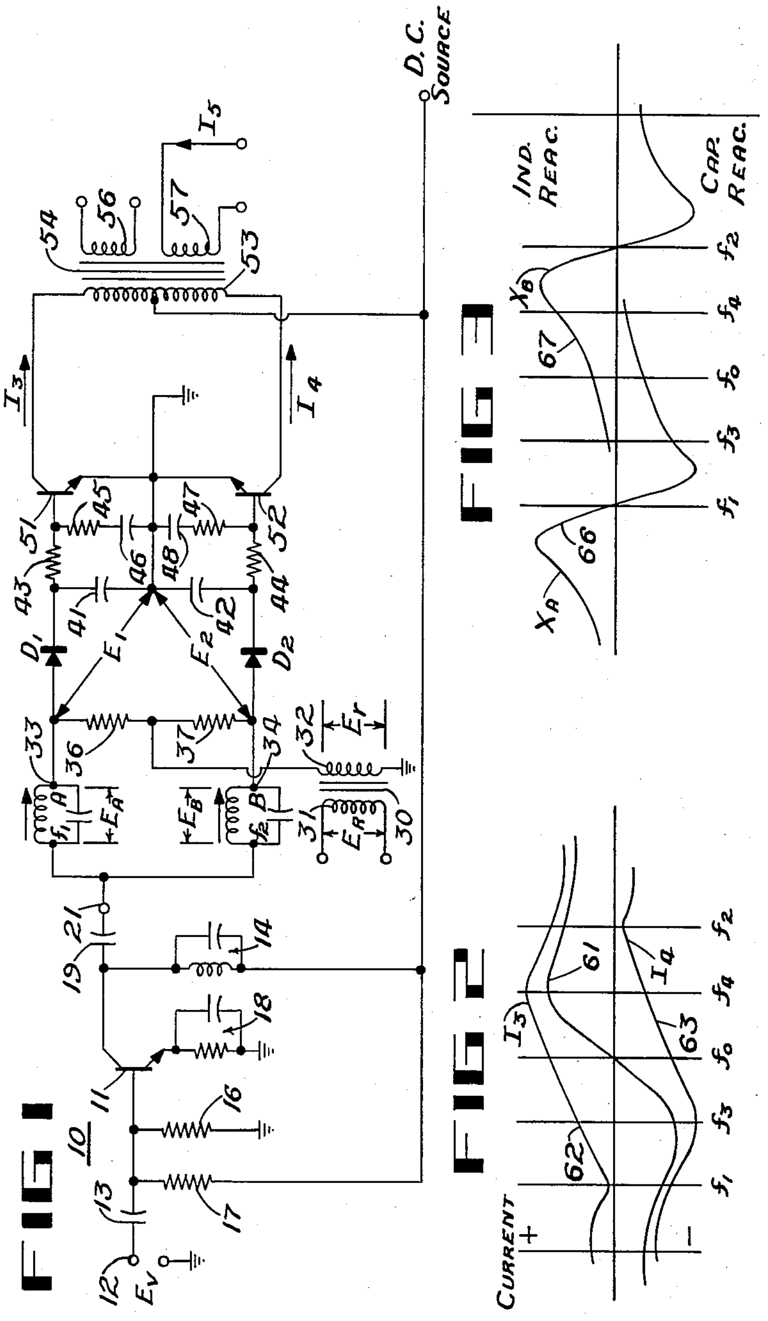
Figure 1 is a schematic of a form of the invention.
Figure 2 shows the output response of the circuit in Figure 1.
Figure 3 illustrates the reactance variation with frequency of the tank circuits in Figure 1.

Now referring to the invention in more detail, the schematic of Figure 1 includes an input source having a relatively low impedance. This can be obtained in a number of ways, but transistor amplifier 10 is used in Figure 1 and has an output impedance of, for example, 15,000 ohms. Amplifier 10 includes a grounded-emitter transistor 11 having its base connected to an input terminal 12, through a blocking condenser 13. An input signal $E_v$ is applied between input terminal 12 and ground.

Transistor amplifier 10 is conventionally connected with a broad-band parallel-resonance circuit 14 connected between a direct-current source and the collector of transistor 11. The output of transistor 11 is provided through a blocking capacitor 19 to a terminal 21 which is the input terminal of the discriminator circuit proper.

A pair of tank circuits A and B each have one end connected to terminal 21. Tank circuit A is anti-resonant at a frequency $f_1$; and tank circuit B is anti-resonant at another frequency $f_2$. Frequencies $f_1$ and $f_2$ are on opposite sides of a chosen discriminator center frequency $f_0$ and equally spaced therefrom.

An isolating transformer 30 has its primary 31 connected to a signal source having a reference frequency $f_r$ equal to the chosen center frequency, $f_0$. Isolating transformer 30 has a low impedance secondary 32 with one end connected to ground. The other end of secondary 32 is connected to the opposite ends 33 and 34 of tank circuits A and B through equal isolating resistors 36 and 37.

A pair of diodes $D_1$ and $D_2$ have their anodes respectively connected to ends 33 and 34 of tank circuits 33 and 34. A pair of equal capacitors 41 and 42 are respectively connected between ground and the cathodes of diodes $D_1$ and $D_2$ and function as radio-frequency signal by-passes.

Items 43, 45 and 46 comprise a low-pass filter for the signal detected by diode $D_1$; and similarly items 44, 47, and 48 comprise a low-pass filter for the signal detected by diode $D_2$. The values of these components depend upon the gain-phase characteristics of the regulator-loop in which the invention is used, and are chosen to maintain stability.

A pair of transistors 51 and 52 have their emitters connected to ground. The base of transistor 51 is connected to the cathode of diode $D_1$ through resistor 43. In a like manner, the base of the other transistor 52 is connected to the cathode of diode $D_2$ through resistor 44.

A winding 53 has its opposite ends connected between the collectors of transistors 51 and 52. A direct-current source is connected to the center tap of winding 53. Winding 53 can be the control winding of a saturable reactor, wherein it is used to vary the flux saturation of a ferromagnetic core 54 in a well-known manner, so that the inductance of another winding 56 on core 54 is varied in a corresponding manner. Thus, in Figure 1 the inductance of winding 56 provides the output of the frequency and phase detector. A steady D.C. current $I_5$ is passed through another winding 57 to produce a magnetic bias in core 54 which sets the mean inductance value about which winding 56 is varied.

When the invention is used in the regulator system of a stabilized-master-oscillator, voltage $E_r$ has a stable-reference frequency; and voltage $E_v$ has a frequency derived from a variable-oscillator that is to be phase-locked with reference voltage $E_r$.

A frequency discriminator requirement for regulator operation is that opposite polarity outputs be provided when variable input frequency $E_v$ is on respectively opposite sides of center frequency $f_0$, about which tank circuits A and B are tuned.

In Figure 2, curve 61 illustrates the composite output due to the frequency discriminator operation of the invention and illustrates the net current through control winding 53 as the frequency is varied for a constant-amplitude voltage $E_v$.

The invention obtains a broader response than the conventional discriminator by designing tank circuits A and B to form complementary high and low pass filters with a cross-over frequency of $f_0$. Composite curve 61 represents the difference between the current outputs $I_3$ and $I_4$ of transistors 51 and 52, respectively. Curve 62 in Figure 2 illustrates the variation with frequency of current $I_3$; and curve 63 illustrates the variation with frequency of current $I_4$. Currents $I_3$ and $I_4$ are detected currents (that is, they are varying D.C. currents) and are shown with opposite polarity in Figure 2 because they pass through control winding 53 in opposite directions. The saturating effect upon the core of control winding 53 is, therefore, determined by the difference between currents $I_3$ and $I_4$, which is curve 61.

Upon observing curves 61 and 62 in Figure 2, it will be seen that current $I_3$ reaches a minimum value at frequency $f_1$ and a maximum value at frequency $f_4$. In a like but reversed manner, it is seen that current $I_4$ reaches a minimum value at frequency $f_2$ and a maximum value at frequency $f_3$. The minimum values of curves 62 and 63 are obtained at the resonant frequencies of tank circuits A and B, which are frequencies $f_1$ and $f_2$ respectively. The reason for these minimum-current responses can be understood by viewing Figure 1. At the resonant frequencies of tank circuits A and B, they present their highest impedance to input signal $E_v$. At these highest impedance values, the net current through them is minimum, and it is this net-current value, which is detected by respective detector $D_1$ or $D_2$ and is amplified as currents $I_3$ or $I_4$, respectively.

The reason for the maximum-response portions of curves 62 and 63 in Figure 2 at frequencies $f_3$ and $f_4$, respectively, is not as obvious. The maximum response of each curve 62 or 63 occurs at the frequency where the tank circuits, together, provide a matched-impedance condition between the output of transistor amplifier 10 and the input to respective detector circuits, having $D_1$ or $D_2$. The circuit of this invention presents complementary L-type circuits with respect to detectors $D_1$ and $D_2$.

Figure 4:
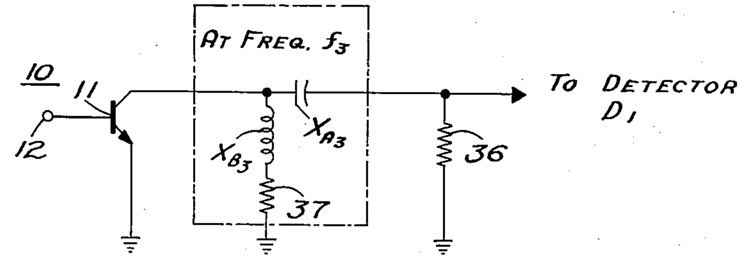
Figures 4, 5 and 6 illustrate equivalent circuits used in explaining the operation of the invention; and, Figure 7 is a vector diagram used to explain the phase-detector operation of the invention.

The impedance-matched condition at frequency $f_3$ is illustrated by the equivalent high-pass L-type circuit of Figure 4. Similarly, the impedance-matched condition provided at frequency $f_4$ is illustrated by the equivalent low-pass L-type circuit of Figure 5.

In Figure 4, at frequency $f_3$, the high-pass L-type equivalent network is provided between the output of amplifier 10 and diode $D_1$; wherein capacitor $X_{A_3}$ represents the net-capacitive reactance of tank circuit A and inductor $X_{B_3}$ represents the net-inductive reactance of tank circuit B. At frequency $f_4$ in Figure 5, the filter provided by tank circuits A and B is reversed to the low-pass L-type equivalent network between the output of amplifier 10 and diode $D_2$; wherein capacitor $X_{A_4}$ represents the capacitive reactance of tank circuit A at frequency $f_4$, and inductor $X_{B_4}$ represents the inductive reactance of tank circuit B at the same frequency.

Figure 5:
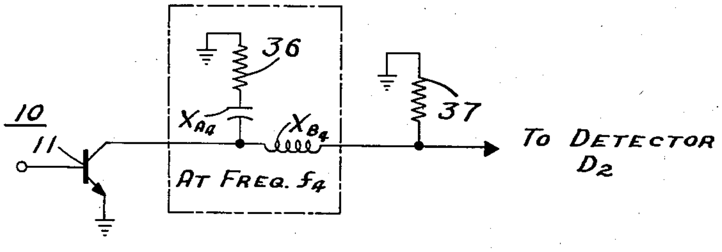

Figure 3 illustrates the reactance situation of the tank circuits as a function of frequency. The situations illustrated in Figures 4 and 5 are observable from Figure 3. Thus, it is seen in Figure 3 that between frequencies $f_0$ and $f_1$, which include frequency $f_3$, tank circuit A provides a capacitive reactance $X_A$ (as given by curve 63); while the other tank circuit B presents an inductive reactance $X_B$ (as given by curve 64). Also it is observed that between frequencies $f_0$ and $f_2$, which include frequency $f_4$, a reversed reactance situation exists with respect to diode $D_2$, with tank circuit A provid'ng a lower magnitude capacitance and tank circuit B providing a higher magnitude inductance.

The over-all response of the discriminator in Figure 1 is represented by composite curve 61 in Figure 2. Curve 61 is the net current in control winding 53 and is the difference between curves 62 and 63 in Figure 2. From this the discriminator action of the invention is apparent. Thus, the discriminator response crosses the zero-amplitude point at frequency $f_0$ and has a large range on each side of frequency $f_0$ as required for broad-band regulator action.

However, it is obviously impossible to effect a phase locked condition due to frequency discriminator action alone. For large initial frequency errors the frequency discriminator may only be able to bring the variable-oscillator frequency to within a few kilocycles of the desired frequency, depending upon the over-all regulator loop gain. It is then necessary to initiate phase discriminator action to bring the signal into a phase locked condition at the desired frequency. In this type of system, it is only necessary that frequency discriminator action bring the signal within the capture range of the phase discriminator operation, which is determined by the envelope phase shift in the loop. In this invention the phase and frequency discriminator circuits are combined so that substantially the same components are used for each, thus resulting a considerable saving in parts and circuit complexity.

Phase-discriminator action requires a reference frequency substantially equal to $f_0$. It is provided by transformer 30, which has a primary connected to a source (not shown) of reference signal, that may be continuous; that is, it need not be shut off during frequency-discriminator action. The reference signal is applied equally to both detectors $D_1$ and $D_2$; and, accordingly, equal and opposite current components $I_3$ and $I_4$ are induced in saturable-reactor winding 53 which cancel and have no effect upon the output of the circuit during frequency-discriminator operation.

In a closed-loop regulator circuit, phase-detector operation occurs not only when input $E_v$ is within plus-or-minus 90° from the reference frequency $E_r$, but also for frequencies on each side of $f_0$ up to where the phase shift of the phase-detected audio-beat envelope between $f_0$ and the variable frequency is plus-or-minus 180°, respectively. The beat-frequency output contains a direct-current component in the output of the phase-detector when there is a difference between its input frequencies. A complete analysis of this action is very complex and will not be presented here since it has been adequately covered in the literature.

Figure 6:
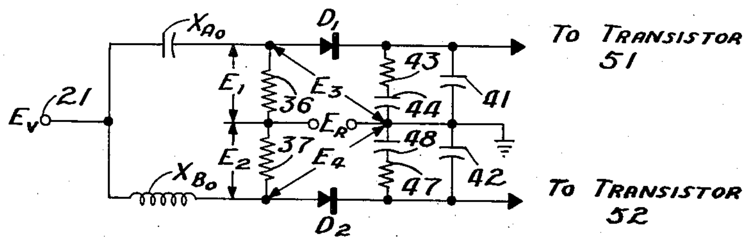
Figure 7:
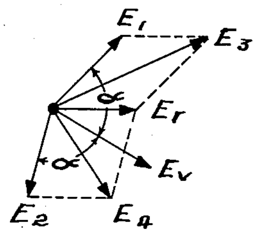

Figure 6 illustrates the condition of the circuit of Figure 1 between frequencies $f_1$ and $f_2$. As shown by Figure 3, tank circuit A presents a capacitive reactance while tank circuit B presents an inductive reactance. These reactances are substantially constant for the relatively small range on either side of $f_0$ over which the phase detector action takes place and are illustrated as $X_{A_0}$ and $X_{B_0}$ in Figure 6. Together with resistances 36 and 37, these reactances form phase-shift networks for the signal voltage $E_v$. The vector example illustrated in Figure 7 results. There, reference vector $E_r$ represents the component of reference voltage $E_r$ appearing across each of the diode circuits. As a result of voltage $E_v$ being applied to terminal 21, it causes a component voltage $E_1$ across the detector circuit of diode $D_1$ that leads voltage $E_v$, and causes another component voltage across the detector circuit of diode $D_2$ that lags voltage $E_v$.

Therefore, a vector summation occurs across the detector circuit of diode $D_1$ that provides vector $E_3$, and diode $D_1$ provides a direct-current component proportional to the magnitude of vector $E_3$.

Similarly, voltage $E_4$ represents the vector summation of reference voltage $E_r$ and lagging component voltage $E_2$ across the detector circuit of diode $D_2$, which provides a direct-current component proportional to the magnitude of vector $E_4$.

The detected magnitudes of voltages $E_3$ and $E_4$ induce opposite circuit currents in saturable reactor winding 53. It can be seen that when voltage $E_v$ is in phase with reference voltage $E_r$, voltages $E_3$ and $E_4$ are equal and, therefore, the net output of the discriminator is zero. On the other hand, it can be seen that when voltage $E_v$ is not in phase with voltage $E_r$, a net direct-current output is provided through winding 53 with a polarity corresponding to the polarity of the instantaneous phase of voltage $E_v$ with respect to $E_r$.

In a model of the invention, typical values were as follows:

Frequency $f_1$ was 440 kilocycles; $f_2$ was 470 kilocycles; $f_0$ was 455 kilocycles; L/C of tuned circuits A and B was $3\times10^4$; resistors 36 and 37 each were 1,000 ohms; transistor 11 was a 904 silicon transistor; transistors 51 and 52 each were a 951 silicon transistor. The pull-in range was ±30 kilocycles (limited by loop bandwidth); and the hold-in range was ±125 kilocycles.

Although this invention has been described with respect to a particular embodiment thereof, it is not to be so limited as changes and modifications may be made therein which are within the full intended scope of the invention as defined by the appended claims.

I claim:

1. A frequency and phase discriminator for operation about a given center frequency $f_0$, comprising first and second parallel-resonant circuits, with said first resonant circuit being tuned to a frequency $f_1$ below $f_0$, and said second resonant circuit being tuned to a frequency $f_2$ above $f_0$, a first input terminal connected to one side of each of said first and second resonant circuits, a first amplitude detector circuit connected in series with the other side of said first resonant circuit, a second amplitude detector circuit connected in series with the other side of said second resonant circuit, a pair of low-pass filters respectively connected between ground and the outputs of said amplitude detectors, a phase reference signal terminal, first impedance means connected between said reference signal terminal and the input of said first amplitude detector, second impedance means connected between said reference signal terminal and the input to said other amplitude detector, an L-circuit being comprised of said first impedance means and said first resonant circuit, and a complementary L-circuit being comprised of said second impedance means and said second resonant circuit.

2. A frequency and phase discriminator for operation about a given center frequency, comprising an input amplifier having a low output impedance and having an output terminal, a first frequency source providing the signal which is to be detected, first and second parallel-resonant circuits, each having an end connected to said output terminal, said first resonant circuit being tuned to a frequency $f_1$ below said center frequency, said second resonant circuit being tuned to a frequency $f_2$ above said center frequency, a first detector circuit connected serially with said other end of said first resonant circuit, a second detector circuit connected serially with said other end of said second resonant circuit, a phase reference frequency source providing a frequency substantially equal to said center frequency, first impedance means connecting said reference source to the input of said first detector circuit, second impedance means connecting said reference source to the input of said second detector circuit, said first resonant circuit and the first impedance means providing an impedance match between said amplifier and said first detector circuit at a frequency between said center frequency and $f_2$, and said second resonant circuit and the second impedance means also providing an impedance match between said amplifier and said second detector circuit at a frequency between said center frequency and $f_1$.

3. A frequency and phase detector operating about a center frequency $f_0$, comprising a transistor amplifier, a first input terminal connected to the input of said transistor amplifier, first and second parallel-resonant circuits, each being connected in series with the output of said transistor amplifier, said first resonant circuit being tuned to a frequency $f_1$ below $f_0$, said second resonant circuit being tuned to a frequency $f_2$ above $f_0$, a first diode being connected in series with said first resonant circuit, a second diode being connected in series with said second resonant circuit, a first low-pass filter being connected between ground and said first diode, a second low-pass filter being connected between ground and said phase-reference diode, a second input terminal, a first resistor connected between said phase-reference input terminal and said first diode, a second resistor connected between said phase-reference input terminal and said second diode, second and third transistor amplifiers having their inputs respectively connected to the outputs of said first and second low-pass filters, said first resonant circuit enabling maximum energy transfer from said first transistor amplifier to said second transistor amplifier at a frequency between $f_0$ and $f_1$, and said second resonant circuit also enabling a maximum energy transfer between said first transistor amplifier and said third transistor amplifier at a frequency between $f_0$ and $f_2$, with current-combining means connected to the outputs of said second and third amplifiers.

4. A frequency and phase discriminator operating about a center frequency $f_0$ and having a low input impedance, comprising first and second parallel-resonant circuits, each having opposite ends, a first signal input terminal connected to one end of each of said resonant circuits, first and second diodes, first and second low-pass filters, said first diode and first low-pass filter being connected between ground and the other end of said first resonant circuit, said second diode and second low-pass filter being connected between ground and the other end of said second resonant circuit, a phase-reference signal input terminal, first resistance means connecting said phase-reference input terminal to the other end of said first resonant circuit, second resistance means connected between said phase-reference input terminal and the other end of said second resonant circuit, an L-type impedance matching circuit being provided by said first tank circuit and first resistance means at a resonant frequency $f_3$, and a complementary L-type impedance matching circuit being provided by said second tank circuit and second resistance means at another resonant frequency $f_4$ on the opposite side of said center frequency $f_0$.

5. A frequency and phase detector operating about a center frequency $f_0$ and having a low input impedance, comprising a first signal terminal, a first transistor amplifier having its input connected to said terminal, first and second parallel resonant circuits, each having opposite connection points, each having one point connected to the output of said first transistor amplifier, first and second diodes, first and second low-pass filters, said first diode and said first low-pass filter being connected between ground and the other point of said first resonant circuit, said second diode and said second low-pass filter being connected between ground and the other point of said second resonant circuit, a phase-reference signal input terminal, a transformer having its primary connected to said phase-reference input terminal, and having one side of its secondary connected to ground, a first resistor connected between the other side of said secondary and said other point of the first resonant circuit, a second resistor connected between said other side of the secondary and said other point of the second resonant circuit, second and third transistor amplifiers having their inputs connected respectively to the outputs of said first and second low-pass filters, a saturable reactor, including a control winding, and the opposite ends of said control winding being connected respectively to the outputs of said second and third transistor amplifiers.

References Cited in the file of this patent

UNITED STATES PATENTS

| | | |
|---|---|---|
| 2,495,023 | Sebring et al. | Jan. 17, 1950 |
| 2,654,032 | Staschover et al. | Sept. 29, 1950 |
| 2,680,160 | Yaeger | June 1, 1954 |
| 2,695,381 | Darling | Nov. 23, 1954 |
| 2,698,392 | Herman | Dec. 28, 1954 |
| 2,781,492 | Spracklen | Feb. 12, 1957 |
| 2,808,508 | Sinninger | Oct. 1, 1957 |
| 2,906,873 | Polyzou et al. | Sept. 29, 1959 |